(12) United States Patent
Uozumi

(10) Patent No.: US 12,068,267 B2
(45) Date of Patent: Aug. 20, 2024

(54) SEMICONDUCTOR DEVICE AND METHOD FOR MANUFACTURING THE SAME

(71) Applicant: Kioxia Corporation, Tokyo (JP)

(72) Inventor: Yoshihiro Uozumi, Shinagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/146,222

(22) Filed: Dec. 23, 2022

(65) Prior Publication Data

US 2023/0130044 A1 Apr. 27, 2023

Related U.S. Application Data

(62) Division of application No. 17/020,438, filed on Sep. 14, 2020, now Pat. No. 11,621,239.

(30) Foreign Application Priority Data

Sep. 19, 2019 (JP) ................. 2019-170519

(51) Int. Cl.
*H01L 23/00* (2006.01)
*H01L 21/50* (2006.01)
*H01L 21/78* (2006.01)

(52) U.S. Cl.
CPC .............. *H01L 24/05* (2013.01); *H01L 21/50* (2013.01); *H01L 21/78* (2013.01);
(Continued)

(58) Field of Classification Search
CPC ......... H01L 24/05; H01L 21/50; H01L 21/78; H01L 2224/83895; H01L 2224/83896;
(Continued)

(56) References Cited

U.S. PATENT DOCUMENTS 8,766,407 B2 7/2014 Endo
8,859,391 B2 * 10/2014 Matsugai .......... H01L 27/14685
438/692

(Continued)

FOREIGN PATENT DOCUMENTS

CN 101295653 A 10/2008
CN 102969336 A 3/2013
(Continued)

*Primary Examiner* — Thanh T Nguyen
(74) *Attorney, Agent, or Firm* — Oblon, McClelland, Maier & Neustadt, L.L.P.

(57) ABSTRACT

A method for manufacturing a semiconductor device is provided, including: preparing a first chip forming portion having a first semiconductor substrate, first metal pads provided at the substrate and a first circuit electrically connected to at least a part of the pads, and a second chip forming portion having a second semiconductor substrate, second metal pads provided at substrate and a second circuit electrically connected to at least a part of the pads; bonding the first and the second chip forming portions while joining the first and the second pads to form a bonding substrate having a non-bonded region between the first and the second chip forming portions at an outer peripheral portion thereof; and filling an insulating film into the non-bonded region, at least a part of the insulating film containing at least one selected from the group consisting of silicon nitride and nitrogen-containing silicon carbide.

19 Claims, 12 Drawing Sheets

(52) U.S. Cl.
CPC ............... *H01L 2224/83895* (2013.01); *H01L 2224/83896* (2013.01); *H01L 2224/94* (2013.01)

(58) Field of Classification Search
CPC ..... H01L 2224/94; H01L 24/08; H01L 24/80;
H01L 2224/05546; H01L 2224/05547;
H01L 2224/05647; H01L 2224/08121;
H01L 2224/08145; H01L 2224/09181;
H01L 2224/80006; H01L 2224/8003;
H01L 2224/80357; H01L 2224/80365;
H01L 2224/80379; H01L 2224/80895;
H01L 2224/80896; H01L 2924/10156;
H01L 2924/10157; H01L 25/18; H01L
2225/06503; H01L 25/0657; H01L 23/24;
H01L 21/54; H01L 24/82; H01L
2224/82201
See application file for complete search history.

(56) References Cited

U.S. PATENT DOCUMENTS

| | | | |
|---|---|---|---|
| 8,975,160 B2 | 3/2015 | Takano | |
| 10,541,230 B2 | 1/2020 | Higuchi et al. | |
| 2008/0268614 A1* | 10/2008 | Yang | H01L 21/2007 438/455 |
| 2012/0049312 A1 | 3/2012 | Tanida et al. | |
| 2013/0049210 A1 | 2/2013 | Endo | |
| 2015/0004738 A1* | 1/2015 | Fujii | H01L 27/14634 438/64 |
| 2016/0093601 A1* | 3/2016 | Ding | H01L 23/544 257/777 |
| 2016/0133788 A1 | 5/2016 | Kim et al. | |
| 2018/0277517 A1* | 9/2018 | Kim | H10B 61/22 |
| 2019/0279952 A1 | 9/2019 | Tagami | |
| 2020/0006145 A1* | 1/2020 | Li | H01L 24/03 |
| 2020/0409592 A1 | 12/2020 | Yang | |
| 2021/0084249 A1 | 5/2021 | Nakazawa et al. | |
| 2021/0320075 A1* | 10/2021 | Hou | H01L 24/05 |

FOREIGN PATENT DOCUMENTS

| | | |
|---|---|---|
| CN | 110246821 A * | 9/2019 |
| JP | 5-47617 A | 2/1993 |
| JP | 05-304062 A | 11/1993 |
| JP | 2012-49249 A | 3/2012 |
| WO | WO 2013/108657 A1 | 7/2013 |
| WO | WO 2015/040784 A1 | 3/2015 |
| WO | WO 2019/131965 A1 | 7/2019 |

* cited by examiner

SEMICONDUCTOR DEVICE AND METHOD FOR MANUFACTURING THE SAME

CROSS REFERENCE TO RELATED APPLICATIONS

This application is a division of and claims benefit under 35 U.S.C. § 120 to U.S. application Ser. No. 17/020,438, filed Sep. 14, 2020, which is based upon and claims the benefit of priority under 35 U.S.C. § 119 to Japanese Patent Application No. 2019-170519, filed on Sep. 19, 2019, the entire contents of each of which are incorporated herein by reference.

FIELD

Embodiments described herein relate generally to a semiconductor device and a method for manufacturing the same.

BACKGROUND

A bonding process where, for example, a semiconductor substrate having memory cells and a semiconductor substrate having a peripheral circuit such as a CMOS are bonded while joining metal pads respectively provided on each of the semiconductor substrates has been applied to enable high-density semiconductor device and effective use of a device area or the like. In the semiconductor device applying the bonding process and a manufacturing method thereof, it is demanded to suppress chipping, peeling, and so on when at least one semiconductor substrate is made thin and to increase quality and manufacturing yield of the semiconductor device.

DETAILED DESCRIPTION

A semiconductor device according to an embodiment includes: a bonding substrate which includes a first chip forming portion having first metal pads provided at a semiconductor substrate and a first circuit electrically connected to at least a part of the first metal pads, and a second chip forming portion having second metal pads joined to the first metal pads and a second circuit electrically connected to at least a part of the second metal pads, the second chip forming portion being bonded to the first chip forming portion; and an insulating film which is filled into a non-bonded region between the first chip forming portion and the second chip forming portion at an outer peripheral portion of the bonding substrate, at least a part of the insulating film containing at least one selected from the group consisting of silicon nitride and nitrogen-containing silicon carbide.

Hereinafter, a semiconductor device according to an embodiment and a manufacturing method thereof are explained with reference to the drawings. In each embodiment presented below, substantially the same components are denoted by the same reference signs, and a description thereof is sometimes partially omitted. The drawings are schematic, and a relationship between a thickness and a planar size, thickness proportions of the respective portions, and the like are sometimes different from actual ones. Terms indicating the up and down directions or the like in the explanation indicate relative directions when a later-described forming surface of metal pads of a first semiconductor substrate is set to be upward unless otherwise specified and may sometimes differ from actual directions based on a gravitational acceleration direction.

First Embodiment

Figure 1:
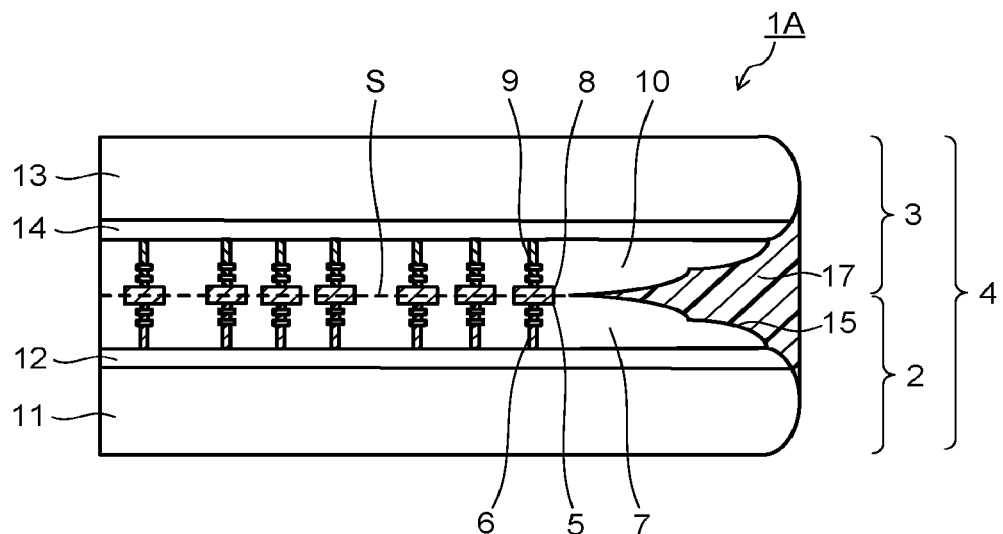
FIG. 1 is a sectional view illustrating a semiconductor device of a first embodiment.
Figure 2:
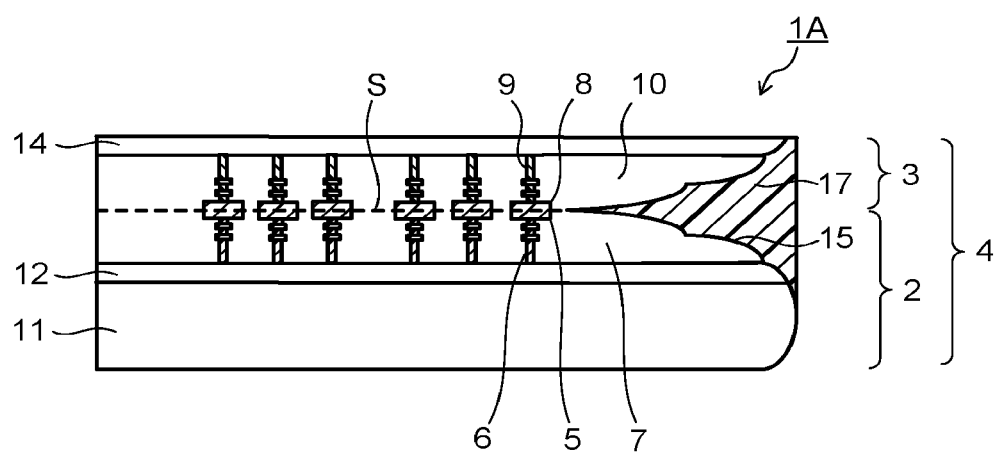
FIG. 2 is a sectional view illustrating a final structure of the semiconductor device of the first embodiment.

FIG. 1 and FIG. 2 are each a sectional view illustrating a part of a semiconductor device 1 (1A) of a first embodiment. FIG. 1 illustrates the semiconductor device 1A at a preliminary step before one of two semiconductor substrates forming a bonding substrate is made thin by back-grinding or chemical treatment (removing), and FIG. 2 illustrates the semiconductor device 1A at a subsequent step after one semiconductor substrate is made thin by back-grinding or chemical treatment (removing).

The semiconductor device 1A illustrated in FIG. 1 includes a first semiconductor substrate 2 and a second semiconductor substrate 3. The first semiconductor substrate (first chip forming portion) 2 and the second semiconductor substrate (second chip forming portion) 3 are bonded to form a bonding substrate 4. That is, the semiconductor device 1A includes the bonding substrate 4. A reference sign S indicates a bonding surface between the first semiconductor substrate 2 and the second semiconductor substrate 3. The bonding surface S is illustrated as a matter of convenience, and a visible joint interface sometimes does not exist because the first semiconductor substrate 2 and the second semiconductor substrate 3 are integrated. It can be distinguished that the first semiconductor substrate 2 and the second semiconductor substrate 3 are bonded by analyzing a cross section of the bonding substrate 4.

The first semiconductor substrate 2 has a plurality of first metal pads 5. A first wiring layer 6 is connected to at least a part of the first metal pad 5. The first metal pads 5 and the first wiring layers 6 are embedded in a first insulating layer 7 as an interlayer insulating film. The second semiconductor substrate 3 has a plurality of second metal pads 8. A second wiring layer 9 is connected to at least a part of the second metal pad 8. The second metal pads 8 and the second wiring layers 9 are embedded in a second insulating layer 10 as an interlayer insulating film. Here, a state where the first and second wiring layers 6, 9 are respectively connected to the first and second metal pads 5, 8 is illustrated, but parts of the first and second metal pads 5, 8 may be dummy pads which are not connected to any wiring layer.

The first semiconductor substrate 2 has a first circuit region 12 where, for example, a first circuit (not-illustrated) including peripheral circuits (not-illustrated) such as a transistor like a CMOS and a passive element, and a wiring layer which connects between these peripheral circuits and at least a part of the first metal pads 5 is provided on a substrate portion 11. The second semiconductor substrate 3 has a second circuit region 14 where, for example, a second circuit (not-illustrated) including a pixel array containing pixels of a plurality of image sensors or a memory cell array containing a plurality of memory cells, a plurality of source lines, a plurality of word lines, a plurality of bit lines, and a wiring layer which is connected to at least a part of the second metal pads 8 is provided under a substrate portion 13. The first and second circuit regions 12, 14 are explained later in detail. The first semiconductor substrate (first chip forming portion) 2 forms, for example, a control circuit chip, and the second semiconductor substrate (second chip forming portion) 3 forms, for example, an array chip.

As illustrated in FIG. 2, the second semiconductor substrate 3 is made thin by performing back-grinding or chemical treatment on the bonding substrate 4 such that at least the second circuit region 14 remains. At least a part of the substrate portion 13 of the second semiconductor substrate 3 is removed. At this time, the substrate portion 13 of the second semiconductor substrate 3 may be remained or not remained. In the semiconductor device 1A illustrated in FIG. 2, the first semiconductor substrate 2 which has the first metal pads 5 and the first circuit region 12 becomes the first chip forming portion. The second semiconductor substrate 3 which has the second metal pads 8 and the second circuit region 14 and from which the substrate portion 13 is eliminated, in other words, the remaining portion of the second semiconductor substrate 3 from which the substrate portion 13 is eliminated becomes the second chip forming portion.

The first metal pads 5 and the second metal pads 8 contribute to bonding between the first semiconductor substrate 2 and the second semiconductor substrate 3. The first insulating layer 7 and the second insulating layer 10 also contribute to the bonding between the first semiconductor substrate 2 and the second semiconductor substrate 3. Copper, copper alloy, or the like is used for the first and second metal pads 5, 8, but they may be formed of a conductive material such as a metal other than the above. Inorganic insulating materials such as silicon oxide (SiO), silicon nitride (SiN), silicon carbide (SiC), silicon oxynitride (SiON), and nitrogen-containing silicon carbide (SiCN) are used for the first and second insulating layers 7, 10, but they may be formed of insulating materials other than the above. Each of the first and second insulating layers 7, 10 may have a structure formed of one kind of material or where a plurality of materials are stacked.

The first semiconductor substrate 2 and the second semiconductor substrate 3 are bonded by directly joining surfaces of the first metal pads 5 exposed at the first semiconductor substrate 2 and surfaces of the second metal pads 8 exposed at the second semiconductor substrate 3 through element diffusion between metals, Van der Waals force, recrystallization due to cubical expansion, melting, and the like, and directly joining a surface of the first insulating layer 7 exposed at the first semiconductor substrate 2 and a surface of the second insulating layer 10 exposed at the second semiconductor substrate 3 through element diffusion between insulating materials, the Van der Waals force, chemical reaction such as dehydration condensation or polymerization, and the like.

When the first semiconductor substrate 2 and the second semiconductor substrate 3 are bonded, the first and second semiconductor substrates 2, 3 are processed through, for example, chemical mechanical polishing (CMP) to planarize surfaces where the first and second metal pads 5, 8 are exposed. When the surfaces of the first and second semiconductor substrates 2, 3 are processed through the CMP, corner portions at an outer periphery may be sometimes rounded off. When the first semiconductor substrate 2 and the second semiconductor substrate 3 as stated above are bonded, a non-bonded region 15 is sometimes generated at an outer peripheral portion of the bonding substrate 4 due to the surfaces which recess resulting the rounded corner portions.

Figure 3:
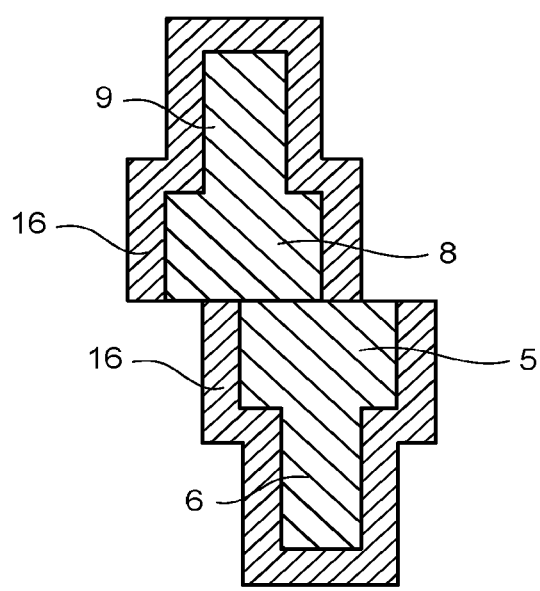
FIG. 3 is a sectional view illustrating an example of a joint state between metal pads in the semiconductor device of the first embodiment.

When the non-bonded region 15 exists at the outer peripheral portion of the bonding substrate 4, the metal material such as copper forming the first and second metal pads 5, 8 may sometimes diffuse to contaminate the semiconductor device 1A. FIG. 3 is a sectional view illustrating an example of a joint state between the first and second metal pads 5, 8 in the semiconductor device 1A. In FIG. 3, a reference sign 16 indicates a barrier metal layer. As illustrated in FIG. 3, the surfaces of the metal pads 5, 8 are exposed at the bonding surface S when misalignment occurs between the first metal pad 5 and the second metal pad 8. There is a possibility that contamination occurs due to the diffusion of the metal material such as copper from the exposed surfaces of the metal pads 5, 8. When the non-bonded region reaches a metal pad portion, the metal surface is exposed to cause spreading of the contamination of the metal material to the substrate in itself and manufacturing apparatuses. These become degradation factors of electric properties of the semiconductor device 1A.

In the semiconductor device 1A of the first embodiment, the non-bonded region 15 generated at the outer peripheral portion of the bonding substrate 4 is filled with an insulating film 17. The insulating film 17 contains at least one selected from silicon nitride (SiN) and nitrogen-containing silicon carbide (SiCN) where film-formation at a low temperature (for example, 450° C. or less) is possible to suppress influence on electric properties of the first and second circuit regions 12, 14. Since SiN or SiCN functions as a diffusion barrier of the metal material such as copper (Cu), it becomes possible to suppress the degradation of the electric properties and the like resulting from the diffusion and the contamination of the metal material such as copper from the exposed surfaces of the first and second metal pads 5, 8. The insulating film 17 may be formed by only SiN or SiCN, but is not limited to it. The insulating film 17 is not limited to be formed of one kind of material, but may be a mixed film or a stacked film of a plurality of materials. There is a possibility that SiN or SiCN may deteriorate in a filling performance into the non-bonded region 15 when the film is formed at the low temperature. As a measure against such a point, it is effective to perform, for example, trimming on a part of the non-bonded region 15 and/or the insulating film 17 (a second, a third, and a fifth embodiments), or the insulating film 17 containing SiN or SiCN and an insulating material excellent in filling performance are used together (a fourth embodiment).

When, for example, a backside of the second semiconductor substrate 3 is ground, what is called back-grinding is performed for the bonding substrate 4 having the non-bonded region 15 at the outer peripheral portion, chipping and peeling are likely to occur to cause degradation of quality and manufacturing yield of the semiconductor device 1A. As a measure against the point, the chipping or the peeling on the occasion of the back-grinding can be suppressed by filling the insulating film 17 into the non-bonded region 15. When the non-bonded region 15 reaches the metal pad portion, the metal surface is in an exposed state to cause spreading of the contamination of the metal material to the substrate in itself and the manufacturing apparatuses. The contamination of the metal material to the substrate and the manufacturing apparatuses at a removing process such as the back-grinding and chemical treatment, and at a manufacturing process after the removing process can be suppressed by filling the insulating film 17 into the non-bonded region 15. The quality and the manufacturing yield of the semiconductor device 1A can be thereby increased. Here, it is conceivable that defects caused by the back-grinding or the like can be suppressed by trimming the outer peripheral portion of the bonding substrate 4 so as to remove a whole of the non-bonded region 15. However, there is a problem that an element forming region becomes small because the trimming region completely removes the non-bonded region. On the other hand, the element forming region can be expanded by filling the insulating film 17 into the non-bonded region 15 because the trimming becomes unnecessary or the trimming region can be reduced even when the trimming is performed.

Figure 4A:
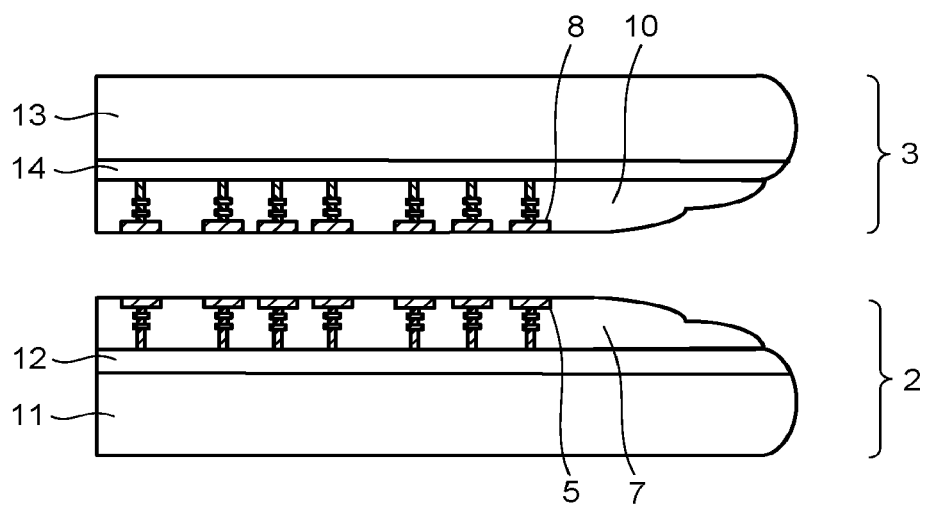
FIGS. 4A to 4D are sectional views illustrating a manufacturing process of the semiconductor device of the first embodiment.

The semiconductor device 1A of the first embodiment is manufactured as, for example, described below. A manufacturing process of the semiconductor device 1A is explained with reference to FIGS. 4A to 4D. First, as illustrated in FIG. 4A, the first semiconductor substrate 2 where the surfaces of the first metal pads 5 and the first insulating layer 7 are exposed and the second semiconductor substrate 3 where the surfaces of the second metal pads 8 and the second insulating layer 10 are exposed are prepared. The surfaces of the first and second semiconductor substrates 2, 3 are each planarized through the CMP. At this time, there is a case when corner portions of the first and second insulating layers 7, 10 of the first and second semiconductor substrates 2, 3 are rounded through the CMP to cause recessing the outside surfaces of the outer peripheral portions of the first and second semiconductor substrates 2, 3.

Figure 4B:
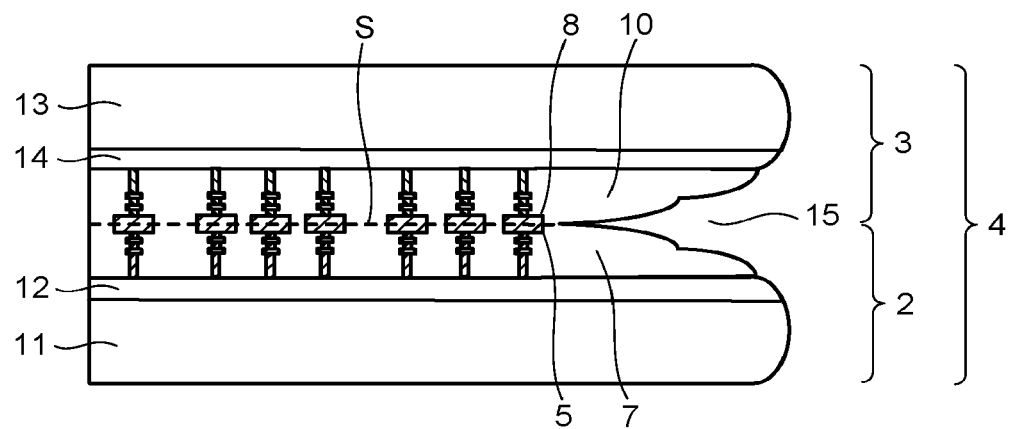

Next, as illustrated in FIG. 4B, the first semiconductor substrate 2 where the surfaces of the first metal pads 5 and the first insulating layer 7 are exposed and the second semiconductor substrate 3 where the surfaces of the second metal pads 8 and the second insulating layer 10 are exposed are bonded. The bonding process is performed under conventionally and publicly-known conditions. For example, the first semiconductor substrate 2 and the second semiconductor substrate 3 are bonded by means of mechanical pressure. The first insulating layer 7 and the second insulating layer 10 are thereby joined to be integrated. Next, the first semiconductor substrate 2 and the second semiconductor substrate 3 are annealed at the temperature of, for example, 400° C. The first metal pads 5 and the second metal pads 8 are thereby joined, and the first and second metal pads 5, 8 are electrically connected and integrated.

Figure 4C:
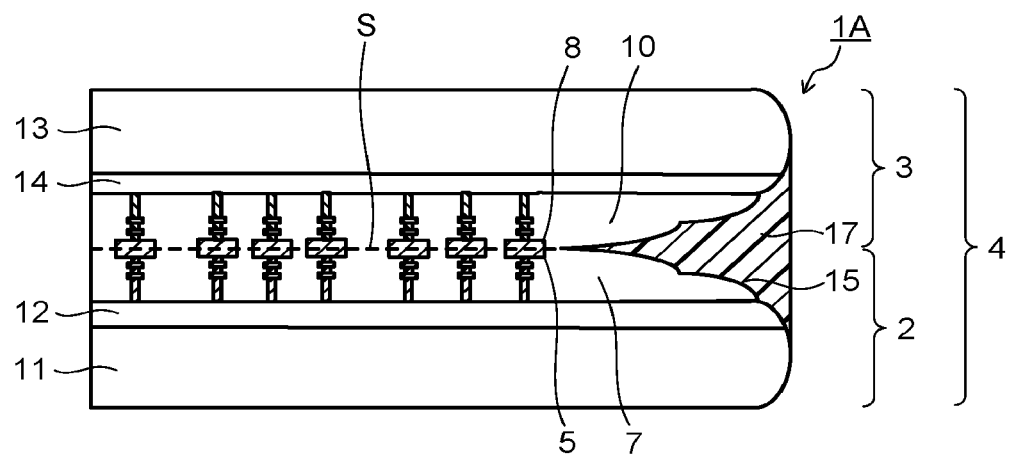

The bonding substrate 4 where the first semiconductor substrate 2 and the second semiconductor substrate 3 are bonded is thereby produced. At this time, the non-bonded region 15 where the first semiconductor substrate 2 and the second semiconductor substrate 3 are not bonded is formed at the outer peripheral portion of the bonding substrate 4 due to the recessing the surfaces resulting from the rounded portions generated at the outer peripheral portions of the first and second semiconductor substrates 2, 3. The non-bonded region 15 becomes a generation factor of the diffusion or the contamination of the metal material such as copper from the exposed surfaces of the first and second metal pads 5, 8, or a generation factor of chipping or peeling when the back-grinding or the like is performed. The insulating film 17 is therefore filled into the non-bonded region 15 as illustrated in FIG. 4C.

The filling process of the insulating film 17 into the non-bonded region 15 is performed by film-forming the insulating material as described above, for example, through outer peripheral CVD (chemical vapor deposition). The insulating film 17 may be filled by film-forming a coating solution containing the insulating material through a coating method. Further, the insulating material is filled into the non-bonded region 15 through the outer peripheral CVD, the outer peripheral coating, and the like, and reflow may be performed to the insulating material. The filling performance of the insulating film 17 into the non-bonded region 15 is sometimes increased by performing the film-forming and the reflow of the insulating material.

Figure 4D:
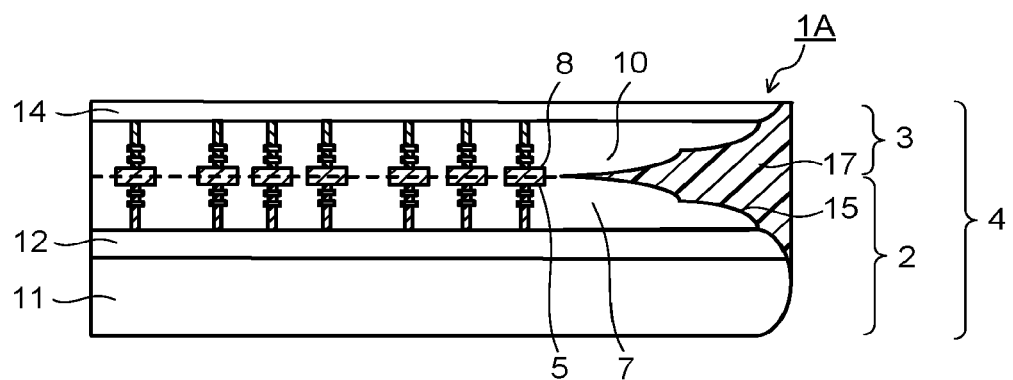

As mentioned above, it becomes possible to suppress the degradation or the like of the electric properties due to the diffusion and the contamination of the metal material such as copper from the exposed surfaces of the first and second metal pads 5, 8 by filling the insulating film 17 containing SiN or SiCN into the non-bonded region 15 generated at the outer peripheral portion of the bonding substrate 4. It is also possible to suppress the chipping and the peeling at post process including the back-grinding resulting from the non-bonded region 15 by filling the insulating film 17 into the non-bonded region 15 generated at the outer peripheral portion of the bonding substrate 4. Accordingly, as illustrated in FIG. 4D, it is possible to make the thickness of the second semiconductor substrate 3 thin to be a desired thickness, in other words, to remove at least a part of the second semiconductor substrate 3 by, for example, performing back-grinding or chemical treatment on a backside of the second semiconductor substrate 3 (a surface opposite to the surface where the second metal pads 8 are formed) without performing trimming of the outer peripheral portion of the bonding substrate 4. According to the semiconductor device 1A and the manufacturing method thereof as mentioned above, not only the manufacturing yield of the semiconductor device 1A can be increased but also characteristics, quality, reliability, and the like of the semiconductor device 1A can be improved. Further, manufacturing cost of a semiconductor chip produced from the semiconductor device 1A can be reduced because an area of the bonding substrate 4 can be effectively used.

Second Embodiment

Figure 5:
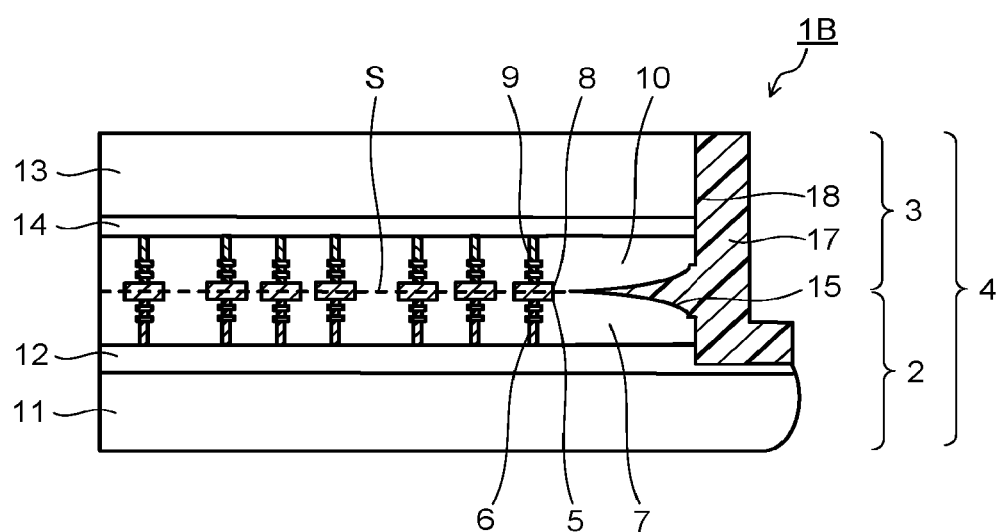
FIG. 5 is a sectional view illustrating a semiconductor device of a second embodiment.

Next, a semiconductor device 1B of the second embodiment is explained with reference to FIG. 5. The semiconductor device 1B illustrated in FIG. 5 includes the bonding substrate 4 which is produced by bonding the first semiconductor substrate 2 and the second semiconductor substrate 3 as same as the first embodiment. Concrete constitutions of the first semiconductor substrate 2 and the second semiconductor substrate 3 are as same as the first embodiment. The bonding substrate 4 has the non-bonded region 15 existing at the outer peripheral portion as same as the first embodiment.

A difference between the semiconductor device 1B of the second embodiment and the semiconductor device 1A of the first embodiment is that the insulating film 17 is filled into the non-bonded region 15 after the trimming of the outer peripheral portion of the bonding substrate 4 is performed, from the second semiconductor substrate 3 side such that at least a part of the first semiconductor substrate 2 remains, or from the first semiconductor substrate 2 side such that at least a part of the second semiconductor substrate 3 remains. The insulating film 17 is formed of the similar insulating material as the first embodiment. The insulating film 17 is not limited to be formed of one kind of material but may be a mixed film or a stacked film of a plurality of materials. The insulating film 17 containing SiN or SiCN can be film-formed at the low temperature, but has a possibility that the filling performance into the non-bonded region 15 deteriorates. It is effective to reduce a volume capacity of the non-bonded region 15 where the insulating film 17 is to be filled by trimming the outer peripheral portion of the bonding substrate 4. The trimming may be performed from the second semiconductor substrate 3 side such that it reaches a part of the first semiconductor substrate 2, and a part of the portion of the non-bonded region 15 of the second semiconductor substrate 3 which faces with the cut portion 18 provided at the outer peripheral portion of the second semiconductor substrate 3 is cut.

That is, a cut portion 18 is provided at the outer peripheral portion of the bonding substrate 4 so as to cut a part of the non-bonded region 15 of the outer peripheral portion of the second semiconductor substrate 3. The cut portion 18 is formed before the insulating film 17 is filled. The cut portion 18 cuts the outer peripheral portion of the second semiconductor substrate 3 while cutting a part of the non-bonded region 15 so as to reach a part of the first semiconductor substrate 2. The cut portion 18 is a stepped portion having a stepped shape which is provided in the outer peripheral portion of the bonding substrate 4. The cut portion 18 is provided at the outer peripheral portion of the bonding substrate 4, and has a stepped shape containing a stepped surface where a side surface of the second semiconductor substrate 3 and a part of a side surface of the first semiconductor substrate 2 are planarized and a horizontal surface formed by flatly cutting a part of the first semiconductor substrate 2. The cut portion (stepped portion) 18 has a first surface (stepped surface/perpendicular surface) containing the side surface of the second semiconductor substrate 3 and the side surface of the part of the first semiconductor substrate 2 and a second surface (horizontal surface) containing a surface recessed from an outside surface of the first semiconductor substrate 2, and the first surface intersects, for example, in a direction perpendicular to the second surface. A part of the non-bonded region 15 is eliminated by the cut portion 18. The insulating film 17 is formed and filled into the cut portion 18 and the remaining portion of the non-bonded region 15.

The filling performance of the insulating film 17 into the non-bonded region 15 can be increased by trimming the outer peripheral portion of the bonding substrate 4 to form the cut portion 18. In the second embodiment, it is not necessary to trim so as to remove the whole of the non-bonded region 15 though the outer peripheral portion of the bonding substrate 4 is trimmed. It is enough that the trimming of the outer peripheral portion of the bonding substrate 4 is performed to an extent capable of increasing the filling performance of the insulating film 17. It becomes therefore possible to effectively use the element forming region in the bonding substrate 4 because the element forming area in the bonding substrate 4 is not extremely decreased compared to a case of removing the whole of the non-bonded region 15. A thickness of the semiconductor device 1B of the second embodiment is made thin by performing back-grinding or chemical treatment on the bonding substrate 4 so as to remain at least the second circuit region 14 as same as the semiconductor device 1A illustrated in FIG. 2 of the first embodiment.

The improvement effect of the filling performance of the insulating film 17 owing to the trimming of the outer peripheral portion of the bonding substrate 4 is effective also when other insulating materials are used without being limited to the insulating film 17 containing SiN or SiCN. That is, various insulating materials can be applied to suppress the chipping and the peeling on the occasion of the back-grinding. The trimming of the outer peripheral portion of the bonding substrate 4 to remove a part of the non-bonded region 15 is effective also in such a case. The third and fifth embodiments described later are also the same. Inorganic insulating materials such as silicon oxide (SiO), silicon nitride (SiN), silicon oxynitride (SiON), nitrogen-containing silicon carbide (SiCN), and aluminum oxide (AlO) can be used as the insulating film in such a case. Silicon oxide containing impurities such as boron (B), phosphorus (P), fluorine (F), and carbon (C), what is called doped-glass may be applied to the insulting film. When the doped-glass is used, it is also effective to perform the low-temperature (for example, at 450° C. or less) reflow after the film formation in order to increase the filling performance.

Figure 6A:
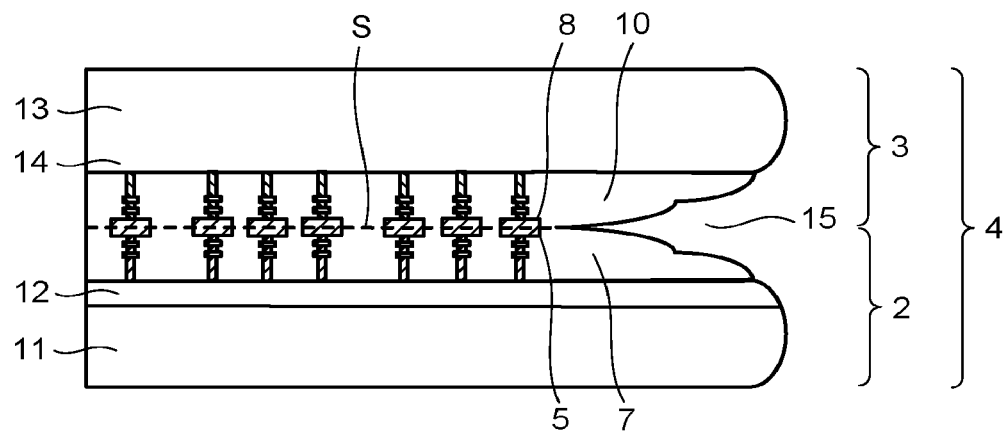
FIGS. 6A to 6D are sectional views illustrating a manufacturing process of the semiconductor device of the second embodiment.

The semiconductor device 1B of the second embodiment is manufactured as, for example, described below. A manufacturing process of the semiconductor device 1B is explained with reference to FIGS. 6A to 6D. As illustrated in FIG. 6A, the first semiconductor substrate 2 where the surfaces of the first metal pads 5 and the first insulating layer 7 are exposed and the second semiconductor substrate 3 where the surfaces of the second metal pads 8 and the second insulating layer 10 are exposed are bonded. Processes until bonding are performed as same as the first embodiment. The non-bonded region 15 where the first semiconductor substrate 2 and the second semiconductor substrate 3 are not bonded is therefore formed at the outer peripheral portion of the bonding substrate 4.

Figure 6B:
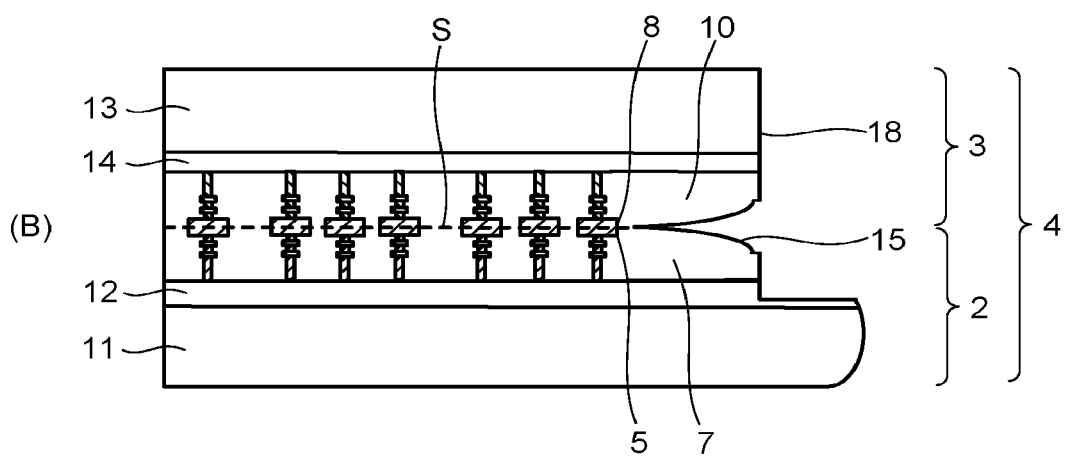
Figure 6C:
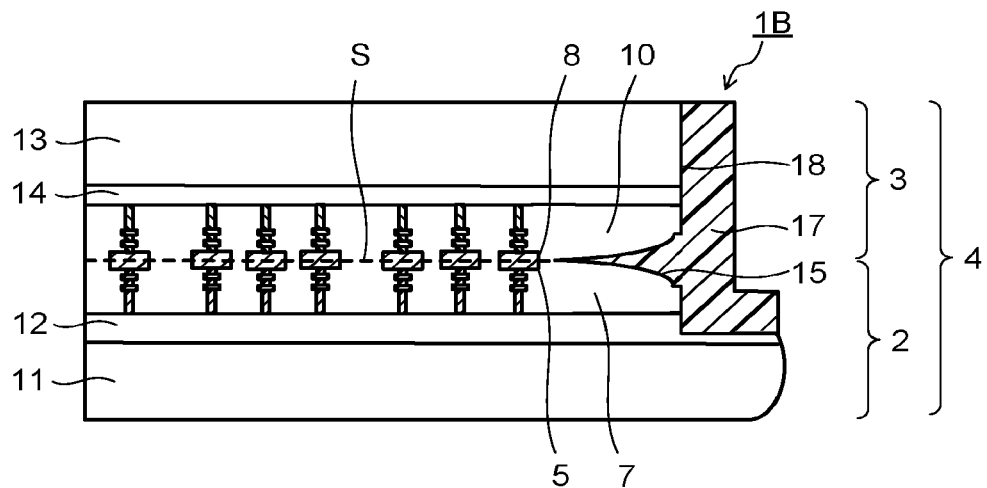
Figure 6D:
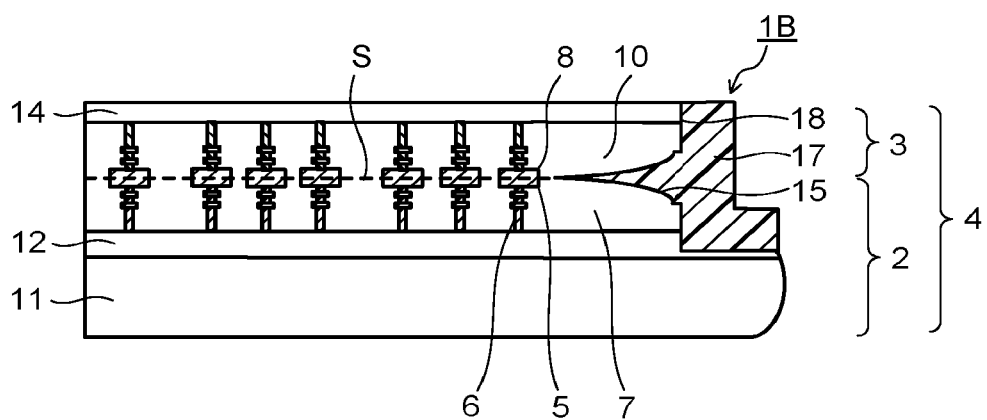

Next, as illustrated in FIG. 6B, the cut portion 18 is formed by trimming the outer peripheral portion of the bonding substrate 4 from the second semiconductor substrate 3 side so that at least a part of the first semiconductor substrate 2 remains. The trimming process is performed by mechanically grinding with, for example, a rotary blade or the like. The cut portion 18 is formed to eliminate only a part of the non-bonded region 15. The element forming area at the bonding substrate 4 is therefore not extremely decreased. Next, as illustrated in FIG. 6C, the insulating film 17 is formed by covering the side surfaces of the first and second semiconductor substrates 2, 3 (first surface) and the horizontal surface of the first semiconductor substrate 2 (second surface) in the cut portion 18 with the insulating material while filling the insulating material into the non-bonded region 15. The filling and forming processes of the insulating material are performed as same as the forming process of the insulating film 17 in the first embodiment. After that, as illustrated in FIG. 6D, for example, the thickness of the second semiconductor substrate 3 can be made thin to a desired thickness by performing the back-grinding or chemical treatment (removing) on the backside of the second semiconductor substrate 3. The trimming may be performed from the first semiconductor substrate 2 side to remain at least a part of the second semiconductor substrate 3.

As mentioned above, the filling performance of the insulating film 17 into the non-bonded region 15 can be increased by filling the insulating film 17 into the non-bonded region 15 after the cut portion 18 is formed at the outer peripheral portion of the bonding substrate 4. It is therefore possible to effectively suppress the degradation of the electric properties due to the diffusion and contamination of the metal material such as copper from the exposed surfaces of the first and second metal pads 5, 8, or the chipping and peeling on the occasion of the back-grinding resulting from the non-bonded region 15. The element forming area at the bonding substrate 4 is not extremely decreased because it is enough that the trimming of the outer peripheral portion of the bonding substrate 4 is performed to an extent capable of increasing the filling performance of the insulating film 17. It is therefore possible to effectively use the element forming region at the bonding substrate 4. According to the semiconductor device 1B and the manufacturing method of the second embodiment, the manufacturing yield of the semiconductor device 1B can be increased, and the electric properties, quality, reliability, and so on of the semiconductor device 1B can be improved as same as the first embodiment. Further, manufacturing cost of a semiconductor chip produced from the semiconductor device 1B can be decreased because the area of the bonding substrate 4 can be effectively used.

Third Embodiment

Figure 7:
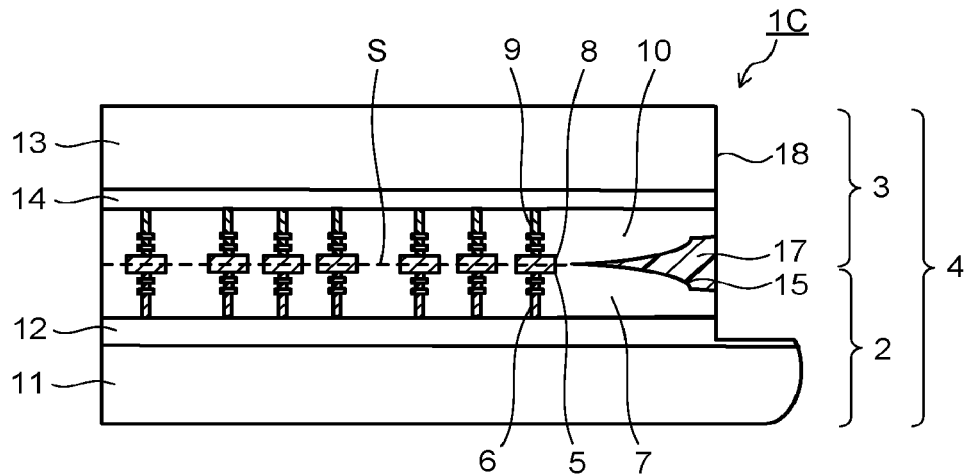
FIG. 7 is a sectional view illustrating a semiconductor device of a third embodiment.

Next, a semiconductor device 1C of the third embodiment is explained with reference to FIG. 7. The semiconductor device 1C illustrated in FIG. 7 has the cut portion 18 which is formed by performing the trimming of a part of the insulating film 17 which is filled into the non-bonded region 15 and the outer peripheral portion of the bonding substrate 4 for the semiconductor device 1A of the first embodiment. A shape of the cut portion 18 is almost the same as that of the second embodiment. That is, the cut portion 18 cuts an outer peripheral portion of the second semiconductor substrate 3 while cutting a part of the insulating film 17 so as to reach a part of the first semiconductor substrate 2. The cut portion 18 in a stepped shape having a stepped surface where a side surface of the second semiconductor substrate 3, the insulating film 17 filled into the non-bonded region 15, and a part of a side surface of the first semiconductor substrate 2 are planarized, and a horizontal surface formed by flatly cutting a part of the first semiconductor substrate 2 is provided at the outer peripheral portion of the bonding substrate 4. The trimming may be performed from the first semiconductor substrate 2 side such that at least a part of the second semiconductor substrate 3 remains. The insulating film 17 is not limited to be formed of one kind of material, but may be a mixed film or a stacked film of a plurality of materials.

In the semiconductor device 1C of the third embodiment, the trimming of the outer peripheral portion of the bonding substrate 4 and the formation of the cut portion 18 according thereto are performed after filling the insulating film 17 into the non-bonded region 15. Even when there is generated a portion where the non-bonded region 15 is not filled with the insulating film 17, that is, there is generated a non-filled portion of the insulating film 17 at an outer peripheral side of the non-bonded region 15 when, for example, SiN or SiCN is film-formed particularly at a low-temperature as the insulating film 17, the non-filled portion can be removed by performing the trimming after the insulating film 17 is filled into the non-bonded region 15. It is therefore possible to effectively suppress the degradation of the electric properties due to the diffusion and contamination of the metal material such as copper from the exposed surfaces of the first and second metal pads 5, 8, or the chipping and peeling at post process including the back-grinding resulting from the non-bonded region 15. A thickness of the semiconductor device 1C of the third embodiment is made thin by performing back-grinding or chemical treatment on the bonding substrate 4 such that at least the second circuit region 14 remains as same as the semiconductor device 1A illustrated in FIG. 2 of the first embodiment.

Fourth Embodiment

Figure 8:
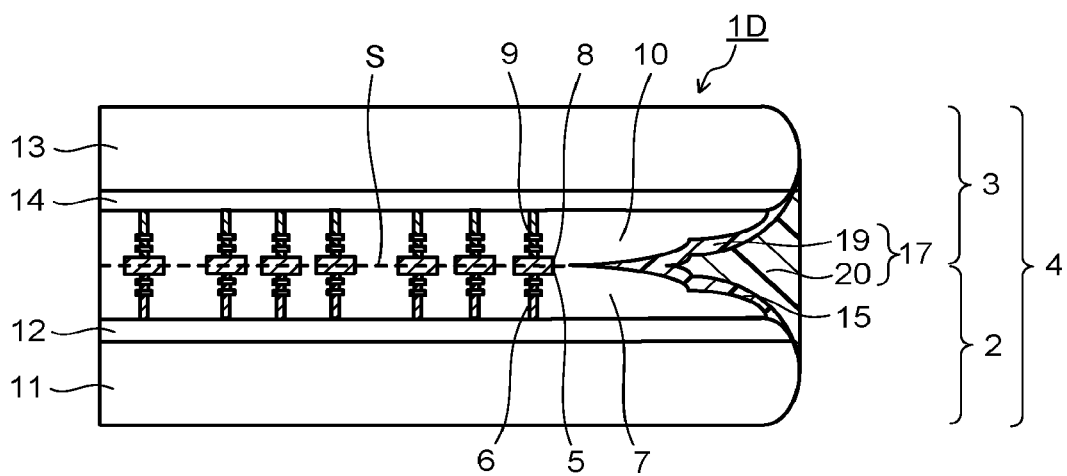
FIG. 8 is a sectional view illustrating a semiconductor device of a fourth embodiment.

Next, a semiconductor device 1D of the fourth embodiment is explained with reference to FIG. 8. The semiconductor device 1D illustrated in FIG. 8 has a similar constitution as the semiconductor device 1A of the first embodiment except that a structure of the insulating film differs. The insulating film 17 in the semiconductor device 1D of the fourth embodiment has a first insulating film 19 which is formed along the surfaces of the first and second semiconductor substrates 2, 3 exposed at the non-bonded region 15 existing at the outer peripheral portion of the bonding substrate 4 and covers these surfaces, and a second insulating film 20 which is filled into the non-bonded region 15 as a non-filled portion of the first insulating film 19. The insulating film 17 in the semiconductor device 1D has the first insulating film 19 which is filled into a first part of the non-bonded region 15 along the surfaces of the first and second semiconductor substrates 2, 3 exposed at the non-bonded region 15, and the second insulating film 20 which is filled into a second part of the non-bonded region 15 other than the first part. The first insulating film 19 contains at least one selected from SiN and SiCN.

There is a possibility that SiN or SiCN deteriorates in filling performance into the non-bonded region 15 particularly when it is formed at the low-temperature. In the semiconductor device 1D of the fourth embodiment, the surfaces of the first and second semiconductor substrates 2, 3 exposed at the non-bonded region 15 are covered with the first insulating film 19 containing SiN or SiCN. The first insulating film 19 is formed in a range (first part) capable of covering the surfaces of the first and second semiconductor substrates 2, 3 exposed at the non-bonded region 15. After the first insulating film 19 is formed, the second insulating film 20 containing silicon oxide (SiO), silicon oxide containing impurities such as B, P, F, C (doped-glass), or silicon oxynitride (SiON) each excellent in the filling performance is filled into the remaining non-bonded region (second part) 15. It is thereby possible to increase the filling performance of the insulating film 17 into the non-bonded region 15 while using the first insulating film 19 containing SiN or SiCN. In particular, it is extremely effective to perform the low-temperature reflow in the film-formation or after the film-formation by using the doped-glass as the second insulating film 20 in order to increase the filling performance of the insulating film 17 into the non-bonded region 15. The first and second insulating films 19, 20 may be each formed by mixing or stacking a plurality kinds of materials without being limited to be formed of one kind of material.

Figure 9:
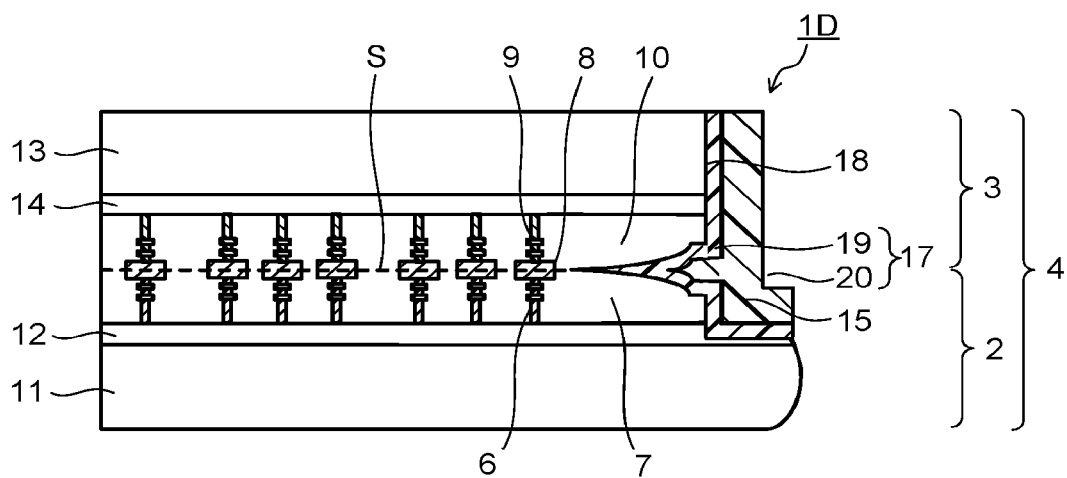
FIG. 9 is a sectional view illustrating a modification example of the semiconductor device of the fourth embodiment.

In the semiconductor device 1D of the fourth embodiment, the insulating film 17 in a two-layer structure may be filled into the non-bonded region 15 after the cut portion 18 is formed by trimming the outer peripheral portion of the bonding substrate 4 as illustrated in FIG. 9. In this case, a manufacturing process similar to the manufacturing process illustrated in the second embodiment can be applied except that the first insulating film 19 and the second insulating film 20 are sequentially formed as the insulting film 17. The first insulating film 19 is formed along the surfaces of the first and second semiconductor substrates 2, 3 exposed at the non-bonded region 15 containing the surface of the non-bonded region 15, and the second insulating film 20 is formed on the insulating film 19 along the stepped shape of the cut portion (stepped portion) 18. The second insulating film 20 may be formed by mixing or stacking a plurality kinds of materials without being limited to be formed of one kind of material. Also in the semiconductor device 1D of the fourth embodiment, a part of the insulating film 17 filled into the non-bonded region 15 and the outer peripheral portion of the bonding substrate 4 may be trimmed after forming the first and second insulating films 19, 20 as same as the third embodiment.

Fifth Embodiment

Next, a manufacturing process of the semiconductor device of the fifth embodiment is explained with reference to FIGS. 10A to 10E, FIG. 11 and FIGS. 12A to 12B. A difference between the manufacturing process of the fifth embodiment and the manufacturing processes of the first to fourth embodiments is that the first semiconductor substrate 2 and the second semiconductor substrate 3 are bonded after the trimming of the outer peripheral part of at least one of the first semiconductor substrate 2 and the second semiconductor substrate 3 is performed. The manufacturing process of the semiconductor device of the fifth embodiment is explained in concrete terms with reference to FIGS. 10A to 10E.

Figure 10A:
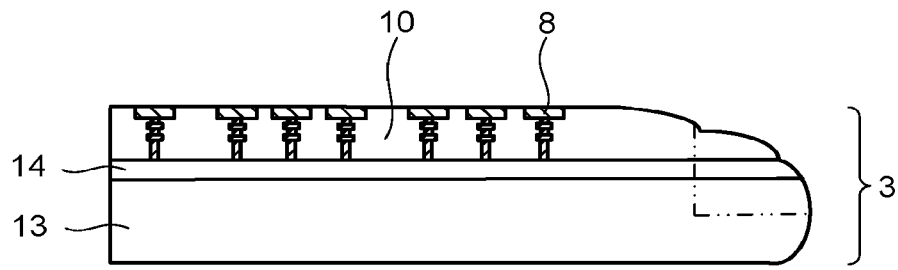
FIGS. 10A to 10E are sectional views illustrating a manufacturing process of a semiconductor device of a fifth embodiment.
Figure 10B:
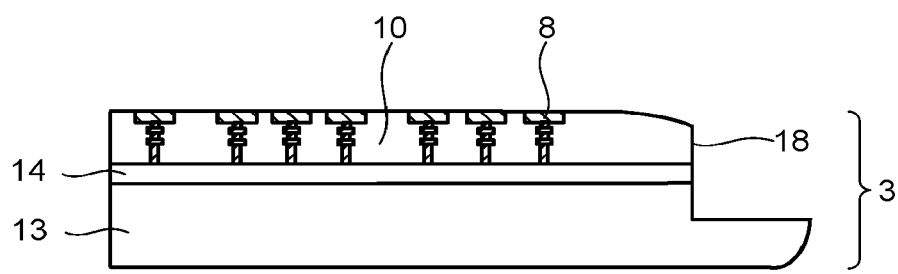

As illustrated in FIG. 10A, the second semiconductor substrate 3 is prepared. The second semiconductor substrate 3 has the similar constitutions as the first embodiment. The first semiconductor substrate 2 is prepared as not illustrated in FIG. 10A. Then, as illustrated in FIG. 10B, the cut portion 18 is formed by trimming the outer peripheral part of the second semiconductor substrate 3. The outer peripheral part of the second semiconductor substrate 3 is trimmed so as to remove a part of outer peripheral side of the second insulating layer 10 and the second circuit region 14 of the second semiconductor substrate 3 and to remove a part of the thickness direction and a part of the surface direction in the outer peripheral side of the second semiconductor substrate 3. The trimming process is performed by mechanically grinding with, for example, a rotary blade or the like.

Figure 10C:
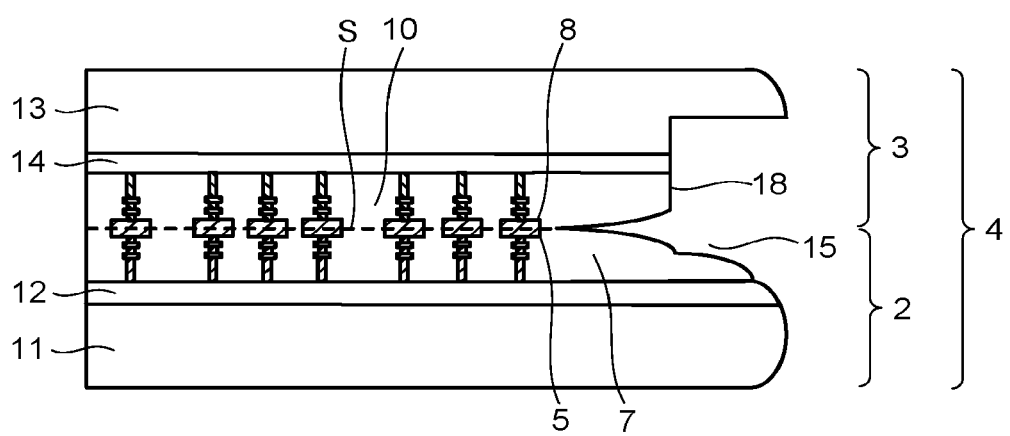

Next, as illustrated in FIG. 10C, the second semiconductor substrate 3 having the cut portion 18 in the outer peripheral part and the first semiconductor substrate 2 are bonded. The bonding process of the semiconductor substrates 2, 3 is performed as same as the first embodiment. The first semiconductor substrate 2 and the second semiconductor substrate 3 having the cut portion 18 in the outer peripheral part are bonded by means of mechanical pressure. The first insulating layer 7 and the second insulating layer 10 are thereby joined to be integrated. In this case, the non-bonded region 15 of the first semiconductor substrates 2 does not have a cut portion at a portion facing the cut portion 18 provided in the outer peripheral part of the second semiconductor substrate 3. Next, the first semiconductor substrate 2 and the second semiconductor substrate 3 are annealed at the temperature of, for example, 400° C. The first metal pads 5 and the second metal pads 8 are thereby joined, and the first and second metal pads 5, 8 are electrically connected and integrated, and thereby, the bonding substrate 4 can be obtained. The second semiconductor substrate 3 has the cut portion 18 in the outer peripheral part, and therefore, a gap of the non-bonded region 15 of the first and second semiconductor substrates 2, 3 in the outer peripheral portion of the bonding substrate 4 spreads out.

Figure 10D:
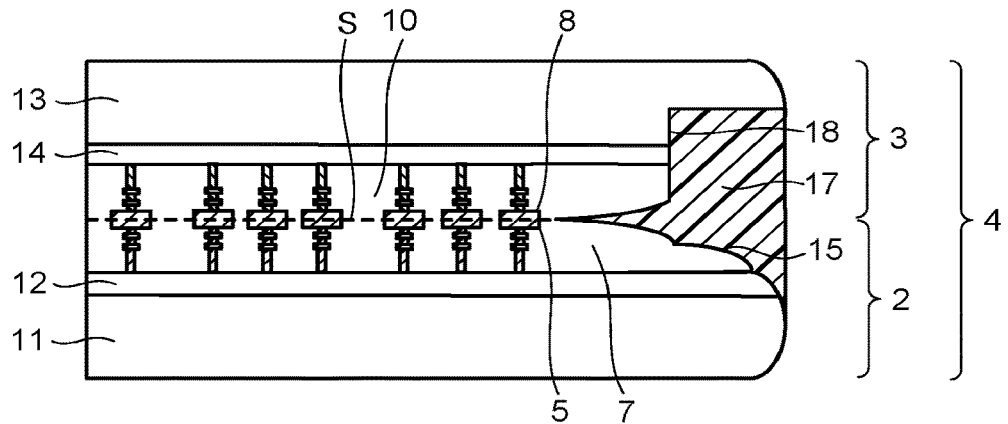

That is, an opening size of the non-bonded region 15 spreads out and the non-bonded region 15 increases in bulk, and thereby, the filling performance of the insulating film 17 into the non-bonded region 15 is increased. As illustrated in FIG. 10D, the insulating film 17 is filled into such a non-bonded region 15. The insulating film 17 is formed by the similar insulating material as the first to fourth embodiments. The insulating film 17 is not limited to be formed of one kind of material, but may be a mixed film or a stacked film of a plurality of materials. The insulating film 17 containing SiN or SiCN can be formed at the low temperature, but may deteriorate in a filling performance into the non-bonded region 15. The filling performance of the insulating film 17 into the non-bonded region 15 can be increased by spreading out the opening size of the non-bonded region 15 and increasing the bulk of the non-bonded region 15.

Figure 10E:
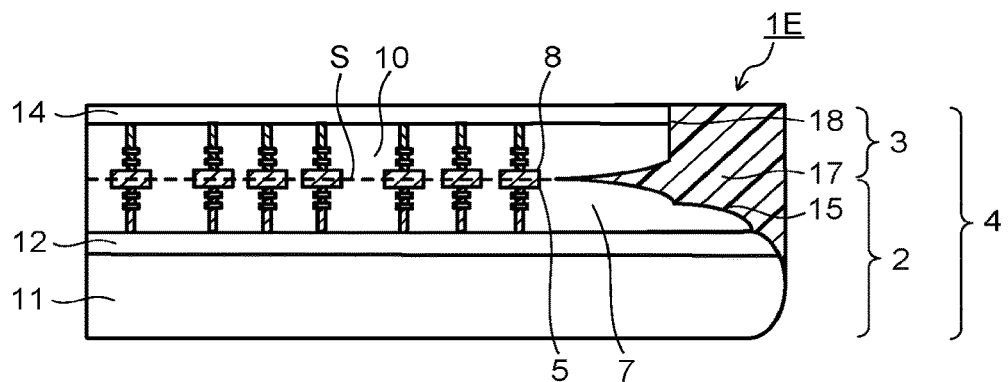

The filling and forming processes of the insulating material are performed as same as the forming process of the insulating film 17 in the first to fourth embodiments. The improvement effect of the filling performance of the insulating film 17 is effective also when other insulating materials are used without being limited to the insulating film 17 containing SiN or SiCN. Various insulating materials can be applied to suppress the chipping and the peeling at post process including the back-grinding. The trimming of the outer peripheral part of the second semiconductor substrate 3 before bonding process is effective also in such a case. Inorganic insulating materials such as SiO, SiN, SiON, SiCN, and AlO can be used as the insulating film in such a case. Silicon oxide containing impurities such as B, P, F, and C, what is called doped-glass may be applied to the insulting film. As illustrated in FIG. 10E, for example, the thickness of the second semiconductor substrate 3 can be made thin to a desired thickness by performing the back-grinding or chemical treatment on the backside of the second semiconductor substrate 3.

As mentioned above, the filling performance of the insulating film 17 into the non-bonded region 15 can be increased by using the bonding substrate 4 produced by bonding the second semiconductor substrate 3 having the pre-trimmed outer peripheral part and the first semiconductor substrate 2. It is therefore possible to effectively suppress the degradation of the electric properties due to the diffusion and contamination of the metal material such as copper from the exposed surfaces of the first and second metal pads 5, 8, and the chipping and peeling on the occasion of the back-grinding resulting from the non-bonded region 15. The element forming area at the bonding substrate 4 is not extremely decreased because it is enough that the trimming of the outer peripheral part of the second semiconductor substrate 3 is performed to an extent capable of increasing the filling performance of the insulating film 17. It is therefore possible to effectively use the element forming region at the bonding substrate 4. According to the manufacturing process of the semiconductor device 1E of the fifth embodiment, the manufacturing yield of the semiconductor device 1E can be increased, and the electric properties, quality, reliability, and so on of the semiconductor device 1E can be improved as same as the first embodiment. Further, manufacturing cost of a semiconductor chip produced from the semiconductor device 1E can be decreased because the area of the bonding substrate 4 can be effectively used.

Figure 11:
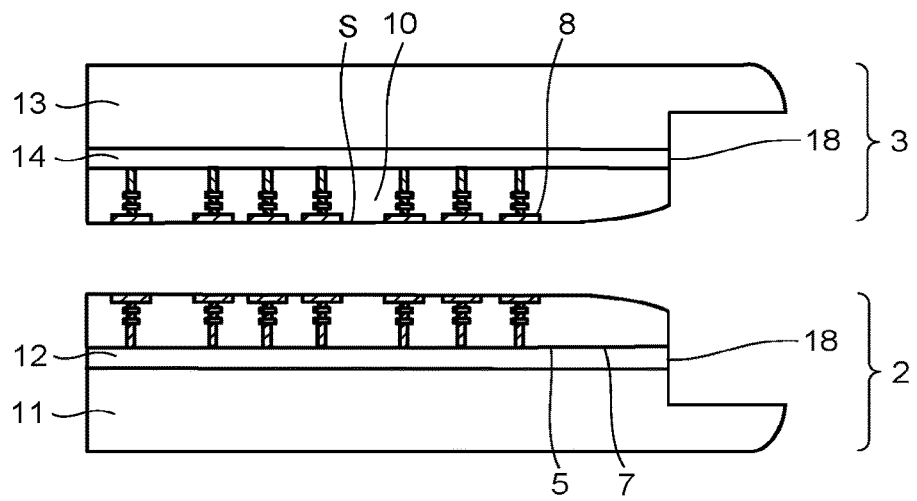
FIG. 11 is sectional views illustrating a first variation example of the manufacturing process of the semiconductor device of the fifth embodiment.

In the manufacturing process of the semiconductor device 1E of the fifth embodiment, the trimming before the bonding process is not limited to be trimmed of the second semiconductor substrate 3. As illustrated in FIG. 11, both of the outer peripheral parts of the first and second semiconductor substrates 2, 3 may be trimmed, and the cut portions 18 of the first and second semiconductor substrates 2, 3 may be formed. In this case, the first semiconductor substrate 2 having the cut portion 18 and the second semiconductor substrate 2 having the cut portion 18 are bonded. Further, only the outer peripheral part of the first semiconductor substrate 2 may be trimmed, and the cut portion 18 of the first semiconductor substrate 2 may be formed.

Figure 12A:
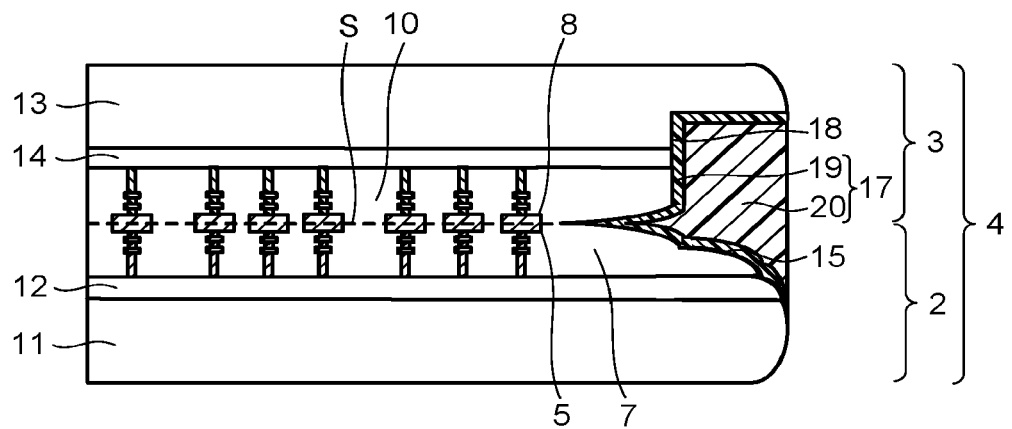
FIGS. 12A and 12B are sectional views illustrating a second variation example of the manufacturing process of the semiconductor device of the fifth embodiment.
Figure 12B:
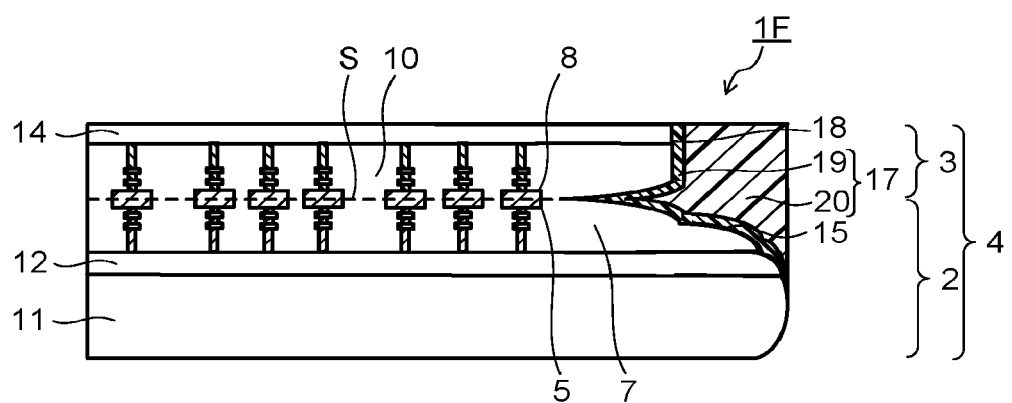

In the manufacturing process of the semiconductor device 1E of the fifth embodiment, the insulating film 17 filled in the non-bonded region 15 of the outer peripheral portion of the bonding substrate 4 is not limited to the insulating material containing SiN or SiCN. As illustrated in FIGS. 12A and 12B, the insulating film 17 may has, as same as the fourth embodiment, a first insulating film 19 which is formed along the surfaces of the first and second semiconductor substrates 2, 3 exposed at the non-bonded region 15, and a second insulating film 20 which is filled into the non-bonded region 15 as a non-filled portion of the first insulating film 19. As illustrated in FIG. 12A, the first insulating film 19 is formed so as to cover the surfaces of the first and second semiconductor substrates 2, 3 exposed at the non-bonded region 15. Then, the second insulating film 20 is filled into the non-bonded region 15 as a non-filled portion of the first insulating film 19. The first and second insulating films 19, 20 are formed as same as the fourth embodiment. Next, as illustrated in FIG. 12B, a thickness of the second semiconductor substrate 3 is made thin by performing back-grinding or chemical treatment on the second semiconductor substrate 3.

The first insulating film 19 contains at least one selected from SiN and SiCN. Since SiN or SiCN functions as a diffusion barrier of the metal material such as copper (Cu), it becomes possible to suppress the degradation of the electric properties of the semiconductor device 1F due to the diffusion and the contamination of the metal material such as copper from the exposed surfaces of the first and second metal pads 5, 8 at the non-bonded region 15 of the bonding substrate 4 by covering the exposed surfaces of the first and second metal pads 5, 8 with the first insulating film 19 containing SiN or SiCN. However, there is a possibility that SiN or SiCN may deteriorate in a filling performance into the non-bonded region 15 when the film of SiN or SiCN is formed at the low temperature. As a measure against such a point, the filling performance of the insulating film 17 into the non-bonded region 15 can be increased by filling the second insulating film 20 into the non-bonded region 15 as a non-filled portion of the first insulating film 19. It is preferable that the second insulating film 20 contains SiO, SiO containing impurities such as B, P, F, C (doped-glass), or SiON each excellent in the filling performance. It is effective to perform the low-temperature reflow in the film-formation or after the film-formation by using the doped-glass as the second insulating film 20 for the improvement of the filling performance of the insulating film 17 into the non-bonded region 15. The first and second insulating films 19, 20 may be each formed by mixing or stacking a plurality kinds of materials without being limited to be formed of one kind of material.

Sixth Embodiment

Next, an example of a semiconductor chip which is produced by using a semiconductor device 1 (1A, 1B, 1C, 1D, 1E and 1F) of the above-stated respective embodiments is explained with reference to FIG. 13. A semiconductor chip 21 illustrated in FIG. 13 includes a control circuit chip 22 formed of a part of the first semiconductor substrate 2 having a first circuit region and an array chip 23 formed of a part of the second semiconductor substrate 3 having a second circuit region. The semiconductor chip 21 is produced by cutting the semiconductor device 1 of each embodiment into separate pieces along respective chip regions. Accordingly, the control circuit chip 22 and the array chip 23 are bonded.

The array chip 23 includes a memory cell array 24 including a plurality of memory cells, an insulating film 25 on the memory cell array 24, and an interlayer insulating film 26 under the memory cell array 24. The control circuit chip 22 is provided under the array chip 23. A reference sign S indicates a bonding surface between the array chip 23 and the control circuit chip 22. The control circuit chip 22 includes an interlayer insulating film 27 and a substrate 28 under the interlayer insulating film 27. The substrate 28 is a semiconductor substrate such as, for example, a silicon substrate. The insulating films 25, 26, 27 are each, for example, a silicon oxide film, a silicon nitride film, a silicon oxynitride film, or the like, and may have a structure formed of one kind of material or where a plurality kinds of materials are mixed or stacked.

Figure 13:
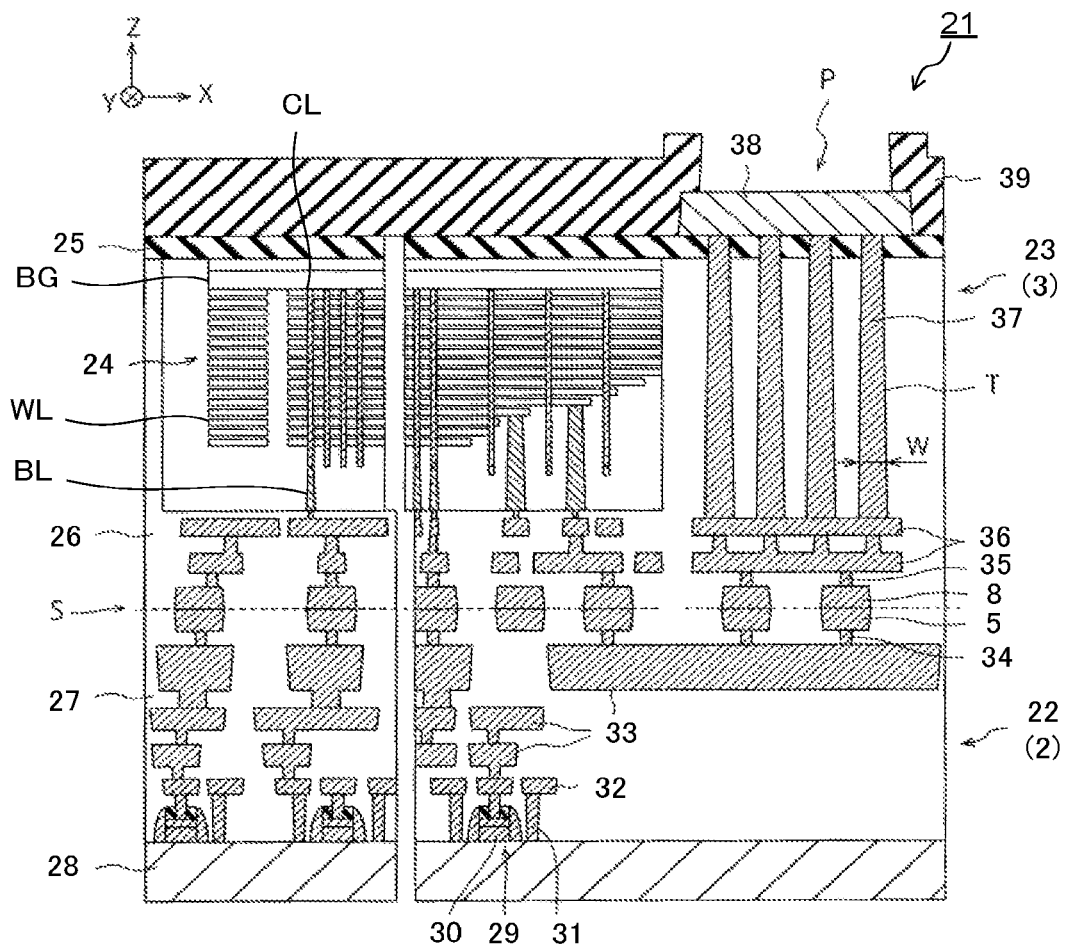
FIG. 13 is a sectional view illustrating a configuration example of a semiconductor chip using the semiconductor device according to the embodiment.

FIG. 13 illustrates an X direction and a Y direction which are in parallel to a surface of the substrate 28 and perpendicular to each other, and a Z direction which is perpendicular to the surface of the substrate 28. Here, a +Z direction is treated as an upper direction, and a −Z direction is treated as a lower direction. For example, in the array chip 23, the memory cell array 24 functioning as the second circuit region is located at an upper side of the substrate 28, and the substrate 28 is located at a lower side of the memory cell array 24. The −Z direction may or may not coincide with a gravitational direction.

The array chip 23 includes a plurality of word lines WL, source lines BG, bit lines BL, and non-illustrated select gates, as electrode layers in the memory cell array 24. FIG. 13 illustrates a constituent containing a stair structure portion of the memory cell array 24. One end of a columnar portion CL which penetrates the word lines WL is electrically connected to the source line BG, and the other end thereof is electrically connected to the bit line BL, and a memory cell is formed at each intersection portion between the columnar portion CL and the word line WL.

The control circuit chip 22 includes a plurality of transistors 29. Each transistor 29 includes a gate electrode 30 provided on the substrate 28 with a gate insulating film formed therebetween, and a non-illustrated source diffusion layer and drain diffusion layer provided in the substrate 28. The control circuit chip 22 further includes a plurality of plugs 31 provided on the source diffusion layer or drain diffusion layer of these transistors 29, wiring layers 32 each provided on the plug 31 and including a plurality of wirings, and wiring layers 33 each including a plurality of wirings provided on the wiring layers 32. The control circuit chip 22 further includes a plurality of via plugs 34 provided on the wiring layers 33 and a plurality of metal pads 5 provided on the via plugs 34 in the insulating film 27. The control circuit chip 22 having the first circuit region as described above functions as a control circuit (logic circuit) controlling the array chip 23.

The array chip 23 includes a plurality of metal pads 8 provided on the metal pads 5 in the insulating film 26, a plurality of via plugs 35 provided on the metal pads 8, and wiring layers 36 including a plurality of wirings provided on the via plugs 35. Each word line WL and each bit line BL are electrically connected to corresponding wirings in the wiring layers 36. The array chip 23 further includes via plugs 37 provided in the insulating film 26 and the insulating film 25 and provided on the wiring layer 36, and a metal pad 38 provided on the insulating film 25 and the via plugs 37.

The metal pad 38 functions as an external connection pad of the semiconductor chip 21 illustrated in FIG. 13, and can be connected to a mounting substrate and other devices through a bonding wire, a solder ball, a metal bump, and the like. The array chip 23 further includes a passivation film 39 formed on the insulating film 25 and the metal pad 38. The passivation film 39 has an opening P which exposes an upper surface of the metal pad 38, and the opening P is used to connect the bonding wire to the metal pad 38, for example.

Note that the above-described configurations in the embodiments are applicable in combination, and parts thereof are also replaceable. While certain embodiments have been described, these embodiments have been presented by way of example only, and are not intended to limit the scope of the inventions. Indeed, those novel embodiments may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    preparing a first chip forming member having a first semiconductor substrate, first metal pads provided at the first semiconductor substrate and a first circuit electrically connected to at least a part of the first metal pads, and a second chip forming member having a second semiconductor substrate, second metal pads provided at the second semiconductor substrate and a second circuit electrically connected to at least a part of the second metal pads;
    bonding the first chip forming member and the second chip forming member while joining the first metal pads and the second metal pads to form a bonding substrate having a non-bonded region between the first chip forming member and the second chip forming member at an outer peripheral portion thereof; and
    filling an insulating film into the non-bonded region of the bonding substrate, at least a part of the insulating film containing at least one selected from the group consisting of silicon nitride and nitrogen-containing silicon carbide, wherein
        the preparing the first chip forming member and the second chip forming member comprises cutting an outer peripheral part of at least one of the first chip forming member and the second chip forming member to form a cut portion, and
        in the bonding the first chip forming member and the second chip forming member, the first chip forming member and the second chip forming member in which at least one thereof has the cut portion, are bonded.

2. The method according to claim 1, wherein the filling the insulating film comprises:
    forming a first insulating film containing at least one selected from the group consisting of silicon nitride and nitrogen-containing silicon carbide, in a first part of the non-bonded region along surfaces of the first and second chip forming members exposed at the non-bonded region, and
    forming a second insulating film containing at least one selected from the group consisting of silicon oxide and silicon oxynitride, in a second part of the non-bonded region other than the first part.

3. The method according to claim 2, wherein the forming the second insulating film comprises:
    forming silicon oxide in which at least one selected from the group consisting of boron, phosphorus, fluorine, and carbon is doped; and reflowing the silicon oxide.

4. The method according to claim 1, further comprising:
    removing at least a part of the second semiconductor substrate in the second chip forming member after filling the insulating film.

5. The method according to claim 1, wherein
    the second chip forming member has the second circuit which includes a plurality of memory cells and a second wiring layer to electrically connect the plurality of memory cells with at least a part of the second metal pads, and functions as a memory cell array chip, and
    the first chip forming member has the first circuit which includes a plurality of transistors and a first wiring layer to electrically connect the plurality of transistors with at least a part of the first metal pads, and functions as a control circuit chip controlling the memory cell array chip.

6. The method according to claim 1, wherein
    the filling the insulating film comprises coating a solution containing an insulating material.

7. The method according to claim 1, wherein
    the filling the insulating film comprises forming the insulating film at a temperature of 450° C. or less.

8. A method for manufacturing a semiconductor device, comprising:
    preparing a first chip forming member having a first semiconductor substrate, first metal pads provided at the first semiconductor substrate and a first circuit electrically connected to at least a part of the first metal pads, and a second chip forming member having a second semiconductor substrate, second metal pads provided at the second semiconductor substrate and a second circuit electrically connected to at least a part of the second metal pads;
    bonding the first chip forming member and the second chip forming member while joining the first metal pads and the second metal pads to form a bonding substrate having a non-bonded region between the first chip forming member and the second chip forming member at an outer peripheral portion thereof;
    cutting a part of at least one of the first chip forming member and the second chip forming member at the outer peripheral portion facing the non-bonded region of the bonding substrate to form a cut portion; and
    filling an insulating film into the cut portion of the non-bonded region of the bonding substrate.

9. The method according to claim 8, wherein
at least a part of the insulating film contains at least one selected from the group consisting of silicon nitride and nitrogen-containing silicon carbide.

10. The method according to claim 8, wherein the filling the insulating film comprises:
forming a first insulating film containing at least one selected from the group consisting of silicon nitride and nitrogen-containing silicon carbide, in a first part of the cut portion along surfaces of the first and second chip forming members exposed at the cut portion, and
forming a second insulating film containing at least one selected from the group consisting of silicon oxide and silicon oxynitride, in a second part of the cut portion other than the first part.

11. The method according to claim 10, wherein forming the second insulating film comprises:
forming silicon oxide in which at least one selected from the group consisting of boron, phosphorus, fluorine, and carbon is doped; and reflowing the silicon oxide.

12. The method according to claim 8, further comprising
removing at least a part of the second semiconductor substrate in the second chip forming member after filling the insulating film.

13. The method according to claim 8, wherein
the second chip forming member has the second circuit which includes a plurality of memory cells and a second wiring layer to electrically connect the plurality of memory cells with at least a part of the second metal pads, and functions as a memory cell array chip, and
the first chip forming member has the first circuit which includes a plurality of transistors and a first wiring layer to electrically connect the plurality of transistors with at least a part of the first metal pads, and functions as a control circuit chip controlling the memory cell array chip.

14. A method for manufacturing a semiconductor device, comprising:
preparing a first chip forming member having a first semiconductor substrate, first metal pads provided at the first semiconductor substrate and a first circuit electrically connected to at least a part of the first metal pads, and a second chip forming member having a second semiconductor substrate, second metal pads provided at the second semiconductor substrate and a second circuit electrically connected to at least a part of the second metal pads;
bonding the first chip forming member and the second chip forming member while joining the first metal pads and the second metal pads to form a bonding substrate having a non-bonded region between the first chip forming member and the second chip forming member at an outer peripheral portion thereof;
filling an insulating film into the non-bonded region of the bonding substrate; and
cutting a part of at least one of the first chip forming member and the second chip forming member at the outer peripheral portion facing the non-bonded region of the bonding substrate and a part of the insulating film.

15. The method according to claim 14, wherein
at least a part of the insulating film contains at least one selected from the group consisting of silicon nitride and nitrogen-containing silicon carbide.

16. The method according to claim 14, wherein the filling the insulating film comprises:
forming a first insulating film containing at least one selected from the group consisting of silicon nitride and nitrogen-containing silicon carbide, in a first part of the non-bonded region along surfaces of the first and second chip forming members exposed at the non-bonded region, and
forming a second insulating film containing at least one selected from the group consisting of silicon oxide and silicon oxynitride, in a second part of the non-bonded region other than the first part.

17. The method according to claim 16, wherein forming the second insulating film comprises:
forming silicon oxide in which at least one selected from the group consisting of boron, phosphorus, fluorine, and carbon is doped; and reflowing the silicon oxide.

18. The method according to claim 14, further comprising removing at least a part of the second semiconductor substrate in the second chip forming member after filling the insulating film.

19. The method according to claim 14, wherein
the second chip forming member has the second circuit which includes a plurality of memory cells and a second wiring layer to electrically connect the plurality of memory cells with at least a part of the second metal pads, and functions as a memory cell array chip, and
the first chip forming member has the first circuit which includes a plurality of transistors and a first wiring layer to electrically connect the plurality of transistors with at least a part of the first metal pads, and functions as a control circuit chip controlling the memory cell array chip.

* * * * *